US 6,498,078 B2

(12) United States Patent
Sadigh et al.

(10) Patent No.: US 6,498,078 B2
(45) Date of Patent: Dec. 24, 2002

(54) METHOD FOR ENHANCING THE SOLUBILITY OF BORON AND INDIUM IN SILICON

(75) Inventors: Babak Sadigh, Oakland; Thomas J. Lenosky, Pleasanton; Tomas Diaz de la Rubia, Danville, all of CA (US); Martin Giles, Hillsborough, OR (US); Maria-Jose Caturla, Livermore; Vidvuds Ozolins, Pleasanton, both of CA (US); Mark Asta, Evanston, IL (US); Silva Theiss, St. Paul, MN (US); Majeed Foad, Santa Clara; Andrew Quong, Livermore, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/945,932

(22) Filed: Sep. 4, 2001

(65) Prior Publication Data

US 2002/0055022 A1 May 9, 2002

Related U.S. Application Data

(60) Provisional application No. 60/230,615, filed on Sep. 5, 2000.

(51) Int. Cl.[7] ................................. H01L 21/20
(52) U.S. Cl. .................. 438/530; 438/544; 438/795
(58) Field of Search ...................... 438/478, 544, 438/530, 479, 795; 428/704, 469, 699, 472.2, 450

(56) References Cited

U.S. PATENT DOCUMENTS

2001/0043903 A1 * 11/2001 D'Evelyn et al. ........... 423/446

OTHER PUBLICATIONS

Babak Sadigh et al. Phys. Rev. Letters vol. 83 No. 21, Nov. 1999, pp. 4341–4344.
P.M. Fahey et al, Rev. Mod. Physics, vol. 61, No. 2, Apr. 1989, pp 289–384.
Paul A. Packan, Science vol. 25 Sep. 1999, pp 2079–2081.
W. Kohn et al, Physical Review, vol. 149, No. 4A Nov. 1965 pp A1133–A1138.
Ecole Normale Supericure et al, Physical Review, vol. 136, No. 3B, Nov 1964, pp. B864–B871.

* cited by examiner

*Primary Examiner*—Savitri Mulpuri
(74) *Attorney, Agent, or Firm*—L. E. Carnahan; Alan H. Thompson

(57) ABSTRACT

A method for enhancing the equilibrium solubility of boron and indium in silicon. The method involves first-principles quantum mechanical calculations to determine the temperature dependence of the equilibrium solubility of two important p-type dopants in silicon, namely boron and indium, under various strain conditions. The equilibrium thermodynamic solubility of size-mismatched impurities, such as boron and indium in silicon, can be raised significantly if the silicon substrate is strained appropriately. For example, for boron, a 1% compressive strain raises the equilibrium solubility by 100% at 1100° C.; and for indium, a 1% tensile strain at 1100° C., corresponds to an enhancement of the solubility by 200%.

13 Claims, 1 Drawing Sheet

METHOD FOR ENHANCING THE SOLUBILITY OF BORON AND INDIUM IN SILICON

This application claims the benefit of Provisional application Ser. No. 60/230,615, filed Sep. 5, 2000.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to solubility of dopants in semiconductor materials, particularly to enhancing the solubility, and more particularly to a method for enhancing solubility of boron and indium in silicon.

Ion implantation allows for exceptional control and reproducibility in the introduction of dopants into the near-surface region of semiconductors. As a result, it has been the universal method of choice for doping MOS transistors in silicon-based integrated circuits since the beginning of the semiconductor revolution. However, an undesirable effect of ion-implantation is that it introduces significant damage into the silicon wafer in the form of point defects and their clusters, Fahey et al Rev. Mod. Phys. 61, 289 (1989). For a device to be operational these defects must be removed and the dopants electrically activated through high-temperature annealing. The annealing procedure leads to unwanted dopant diffusion, as well as nucleation and growth of dopant clusters and precipitates which results in incomplete activation.

Experience has shown that the solubility of boron in silicon under non-equilibrium thermodynamic conditions prevailing during the annealing procedure, i.e., in the presence of excess silicon self-interstitial atoms, is lower than its equilibrium thermodynamic value. The latter thus determines an upper bound for the concentration of substitutional B atoms in silicon. As technology continues to evolve toward smaller and faster transistors, this limit may soon be reached unless new ideas and/or technologies are brought forward that can reduce dopant diffusion during processing while at the same time increasing their electrical activity, see Packan,, Science 285,2079 (1999).

The most widely used p-type dopant, i.e., boron, has a maximum solubility of less than 1 at. % in silicon at the annealing temperature of interest. This sets the limit for the highest concentration of electrically active boron impurities that can be reached with current implantation techniques. Already the next generation of transistors will be dangerously close to this solubility limit. Another p-type dopant candidate with excellent diffusion properties, i.e., indium, has been used only on a small scale mainly because of its very low solubility in silicon. Thus, there is a need to remedy this acute problem faced by the semiconductor industry.

The present invention provides a solution to the above-reference problem by a method for enhancing the solubility of boron and indium in silicon. The invention is based on the use of first-principles density-functional theory (DFT) in the local-density approximation (LDA) to calculate the temperature dependence of the equilibrium solubility of boron and indium in crystalline silicon under various strain conditions. Verification of this invention has shown that the equilibrium thermodynamic solubility of significantly size-mismatched dopants in silicon, such as boron or indium, can be raised by more than 100% if the silicon substrate is strained appropriately.

SUMMARY OF THE INVENTION

It is an object of the present invention to increase the solubility of dopants in semiconductor substrate materials.

A further object of the invention is to provide a method for enhancing the solubility of dopants in silicon.

Another object of the invention is to provide a method for enhancing the solubility of boron and indium in silicon.

Another object of the invention is to utilize strain in a semiconductor substrate to increase solubility of dopants therein.

Another object of the invention is to induce tensile strain or compression (bi-axials) strain under elevated temperatures for increasing solubility of dopants in semiconductor materials, such as silicon.

Another object of the invention is to enhance the solubility of dopants, such as boron and indium, in silicon by at least 100% using a 1% compression or tensile strain at an elevated temperature.

Other objects and advantages of the present invention will become apparent from the following description and accompanying drawings. Basically the invention involves increase the solubility of dopants in a semiconductor material. More specifically the invention involves a method for enhancing solubility of boron and indium in silicon. As a result of the method of this invention the solubility of a dopant, such as boron or indium, in a semiconductor material, such as silicon, is increased by over 100%. This is accomplished by imposing a strain of the semiconductor material under an elevated temperature. Thus, this invention greatly advances the state of the art of silicon processing for manufacturing of integrated circuit devices, for example. It has been determined by this invention that the equilibrium thermodynamic solubility of size-mismatched impurities, such as boron and indium in silicon, can be raised significantly if the silicon substrate is strained appropriately. For example, a 1% compression (bi-axial) strain of silicon raises the equilibrium solubility of boron in silicon by 100% at 1100° C., or 1% tensile strain of silicon at 1100° C. enhances the solubility of indium in silicon by 200%.

BRIEF DESCRIPTION OF THE DRAWINGS

The accompanying drawings, which are incorporated into and form a part of the disclosure, illustrate the method of the invention and, together with the description, serve to explain the principles of the invention.

DETAILED DESCRIPTION OF THE INVENTION

Figure 1:
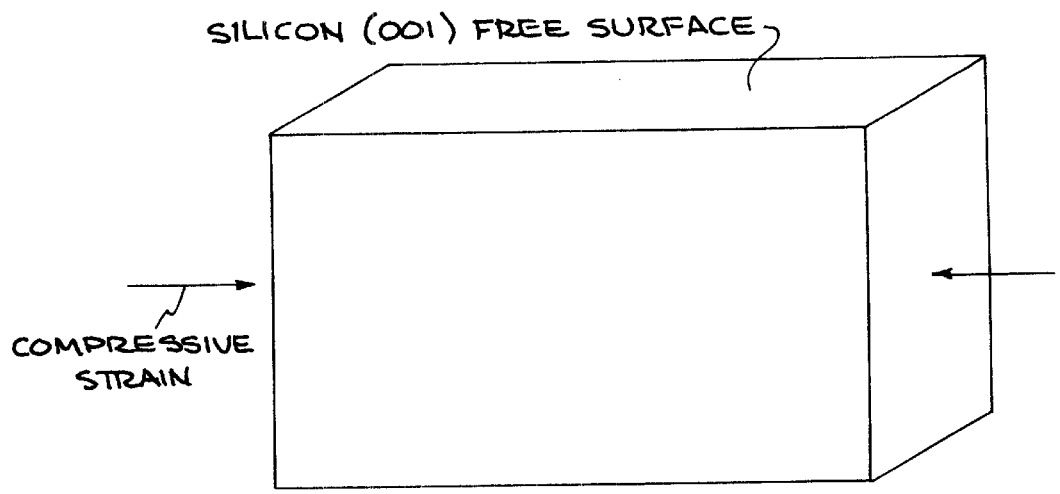
FIG. 1 illustrates a compression strain induced in a silicon substrate.

The present invention involves increasing the solubility of dopants in semiconductor materials, particularly increasing the solubility of boron and indium in silicon. This is basically accomplished by placing a strain on the silicon at elevated temperatures. For example, it has been demonstrated that a 1% compressive strain raises the equilibrium solubility by 100% at 1100° C. for boron, and for indium a 1% tensile strain at 1100° C. corresponds to an enhancement of solubility by 200%. This method for enhancing the solubility of boron and indium in silicon resulted from the performance of first-principles quantum mechanical calculation relative to the temperature dependence of the equilibrium solubility of two important p-type dopants in silicon, namely boron and indium under various strain conditions. It was found that the equilibrium thermodynamic solubility of size-mismatched impurities, such as boron and indium in silicon, can be raised significantly if the silicon substrate is strained accordingly. The following partially sets forth theory basis, procedures, and data relative to the present invention.

The first-principles density-functional theory (DFT) [Phys. Rev. 136, B864 (1964)] in the local-density approximation (LDA) [Phys. Rev. 140, A1133 (1965)] was used to calculate the temperature dependence of the equilibrium solubility of B and In in crystalline Si under various strain conditions. We show that the equilibrium thermodynamic solubility of size-mismatched dopants in silicon, such as B or In, can be raised significantly if the Si substrate is strained appropriately. For boron, we demonstrate that a 1% compressive strain raises the equilibrium solubility by 100% at 1100° C. For In, an equivalent tensile strain at the same temperature corresponds to an enhancement of the solubility by 200%.

The Si—B binary phase diagram shows that at 1200° C., the solid solubility of B in Si is about 1 at. %. Beyond this concentration the excess B atoms can form precipitates of a second phase, i.e., the $SiB_3$ phase which is stable at 75 at. % B concentration. This phase has a complicated structure based on distorted boron-rich icosohedral clusters, which suggests that $SiB_3$ precipitates formed in the two phase region of the Si—B phase diagram, are incoherent with the underlying cubic diamond structure of the pure Si crystal. Under these conditions one can derive the following expression for the maximum soluble B concentration in Si($[B]_{max}$):

$$[B]_{max} \sqrt{n(T)} \exp\ (\Delta H/(2\ k_B T)-E_{gap}/(4\ k_B T)). \quad (1)$$

Here n(T) is the intrinsic carrier concentration in Si, $k_B$ is the Boltzmann constant, T is the temperature and $E_{gap}$ is the electronic band-gap in Si. The enthalpy of solution ($\Delta H$) is further derived to be:

$$\Delta H=4/3(E(SiB_3)-E(Si))-(E(B^-)-E_F-E(Si)), \quad (2)$$

where $E(SiB_3)$ and $E(Si)$ denote the total energies per atom for the $SiB_3$ and pure Si phases respectively. Furthermore $E(B^-)$ is the energy of an isolated negatively charged substitutional B impurity and $E_F$ is the Fermi level which depends on the temperature as well as the B concentration. Below we present our first-principles calculations for these quantities and discuss their dependence upon strain.

In our calculations the unstrained Si crystal is represented by a cubic diamond lattice grown along the (001) direction with a lattice constant $a_{eq}$=5.39 a.u., corresponding to the LDA prediction. A biaxial strain of x% is applied by changing the lattice constant of the {001} layers to $a_{\{001\}}$= $a_{eq}$(1+0.01x) while choosing an interlayer spacing that minimizes the total energy of the system (FIG. 1).

Figure 2:
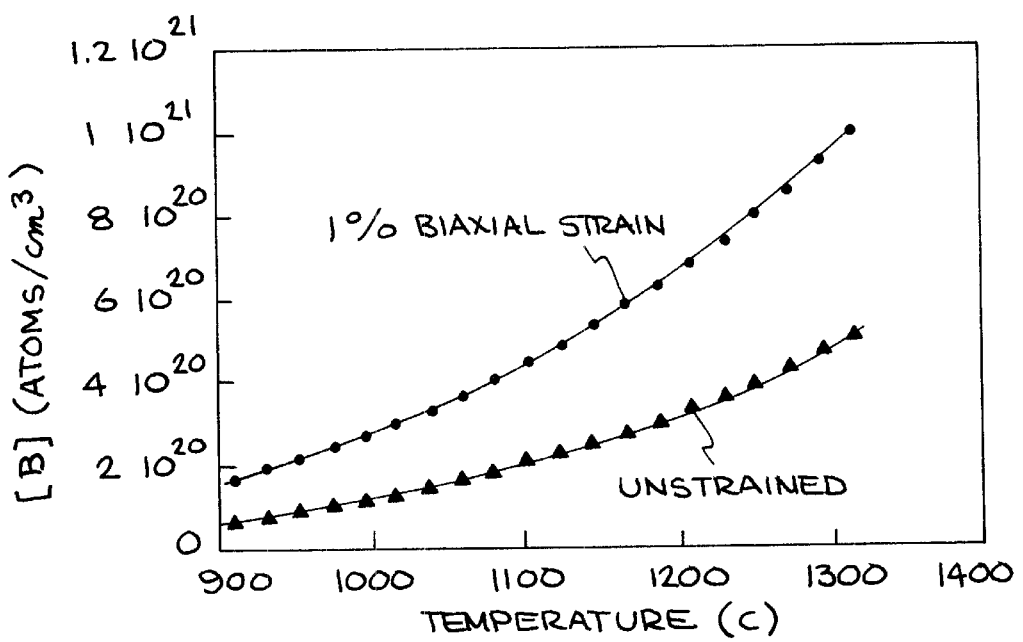
FIG. 2 graphically illustrates the temperature dependence of boron solubility in 1% strained silicon and unstrained silicon.

For the unstrained case we obtained an enthalpy of solution $\Delta H$=0.762 eV. Experimentally, over the range 900° to 1325° C., B solubility shows an exponential dependence on temperature exp(–$E/k_B T$), where E=0.73±0.04 eV. A similar fit of the theoretically derived temperature dependence yields nearly perfect agreement, i.e., E=0.80 eV. These results are illustrated FIG. 2.

We find that compressive biaxial strain enhances the B solubility by reducing $E_{gap}$ and increasing $\Delta H$ in Eq. 1. More precisely a one percent compressive strain, i.e., $a_{\{001\}}$=0.99 $a_{eq}$, leads to an increase in $\Delta H$ of 0.1 eV and a decrease in $E_{gap}$ of 0.11 eV. The resulting B solubility is illustrated in Table 1, where it is compared with the unstrained case. Hence, we find that a 1% biaxial compression can raise $[B]_{max}$ by more than 100% at 1100° C.

TABLE 1

(Boron Solubility Calculation)

$$[B] = Ae^{\frac{\Delta G}{kT}} \text{ where } \Delta G = \Delta H + P\Delta V - T\Delta S$$

$$\Delta H = \frac{4}{3}[E(B_3Si) - E(Si)] - [E(B^-) - E(Si) - E_F]$$

$$\Delta E_F \approx -kT \ln\left(\frac{[B]}{n_i(T)} + \frac{n_i(T)}{[B]}\right)$$

$$[B] \approx \sqrt{A\ e^{\frac{\Delta s}{k}}\ e^{\frac{\Delta H_0}{kT}}\ e^{\frac{P\Delta V}{kT}}\ n_i(T)}$$

$$n_i \propto T^{\frac{3}{2}} e^{-\frac{Eg}{2kT}}$$

In practice, it can be problematic to prepare a strained Si wafer for ion-implantation and subsequent annealing. One way is epitaxial growth on a slightly size-mismatched substrate with the same structure, i.e., diamond structure. Silicon wafers are naturally produced with a good amount of carbon contamination in them. However, the extremely low solubility of carbon in silicon results in polycrystalline substrates which renders them useless for this application. Zinc-Sulfite (ZnS) is a material with diamond structure and a lattice constant that is about 0.4% smaller than Si. ZnS wafers can be produced cheaply and silicon thin films grown epitaxially on them, will accept a significantly higher concentration of soluble boron dopants. Strains of the order of 0.4% can be achieved by epitaxial growth of silicon on a ZnS substrate along (001) direction.

Using the same approach for In we find that a small expansive strain, i.e., for $a_{\{001\}}>a_{eq}$, will lead to significant enhancement of its solid solubility in Si. In particular we find that a 1% biaxial tensile strain, i.e., $a_{\{001\}}$=1.01 $a_{eq}$, increases $\Delta H$ by 0.15 eV and reduces $E_{gap}$ by 0.17 eV (cf. Eq.1). These numbers correspond to an increase in In solubility in Si of about 200% at 1100° C. Hence we expect to reach much higher dopant concentrations if we ion-implant the In atoms into a thin layer of Si, grown epitaxially on top of a $Si_{80}$—$Ge_{20}$ alloy. An even cheaper way would be to use an AlP substrate. This material is in diamond structure with a 0.6% larger lattice constant than silicon.

It has thus been shown that the present invention enables enhancing of the solubility of boron and indium in silicon by placing the silicon substrate under strain at an elevated temperature. By placing a silicon substrate at a 1% compressive (bi-axial) strain at 1100° C., equilibrium solubility raises by 100%, and stains of the order of 0.4% can be achieved by epiaxial growth of silicon on a Zinc-Sulfite (ZnS) substrates along the (001) direction. By placing a silicon substrate at a 1% tensile strain at 1100° C., the enhancement of the solubility is 200%, strains of this magnitude can be achieved by epitaxial growth of silicon on a $Si_{80}$—$Ge_{20}$ alloy substrate. Smaller strains of the order of 0.6% can be achieved cheaply by growing silicon on a Aluminum Phosphate (AlP) substrate along the (001) direction. This invention has clear application in silicon processing for the manufacture of integrated circuit devices.

While particular embodiments of the invention along with particular materials and parameters have been described or illustrated to exemplify and teach the principles of the invention, such are not intended to be limited. Modifications and changes may become apparent to those skilled in the art, and it is intended that the invention be limited only by the scope of the appended claims.

What is claimed:

1. A method for enhancing solubility of boron and indium in silicon, comprising:

applying a strain of 1% to the silicon under an elevated temperature, and increasing the equilibrium solubility of boron or indium by 100% to 200%.

2. The method of claim 1, wherein the dopant is boron, and the strain. applied is a compression strain, 3. The method of claim 1, wherein the dopant is indium, and the strain applied is tensile strain.

4. The method of claim 1, additionally including forming a substrate of silicon composed of epitaxial silicon on a ZnS substrate along a (001) direction.

5. The method of claim 1, additionally including forming the silicon by growing silicon on an AlP substrate along a (001) direction.

6. The method of claim 1, wherein the elevated temperature is about 1100° C.

7. In a method for doping a semiconductor material, the improvement comprising:

enhancing the equilibrium solubility of the dopant in the semiconductor material by at least a 100% increase, and the enhancing being carried out by imposing a strain of 1% on the semiconductor material of silicon and at an elevated temperature.

8. The improvement of claim 7, wherein imposing the strain on the semiconductor material is carried out by imposing a compression strain or a tensile strain.

9. The improvement of claim 7, wherein the elevated temperature is about 1100° C.

10. The improvement of claim 7, wherein the semiconductor material is composed of silicon and the dopant is selected from the group consisting of boron and indium.

11. The improvement of claim 7, additionally including providing the semiconductor material by the epitaxial growth of silicon on a $Si_xGe_{1-x}$ alloy substrate.

12. The improvement of claim 7, additionally including providing the semiconductor material by epitaxial growth of silicon on a ZnS substrate along (001) direction.

13. The improvement of claim 7, additionally including providing the semiconductor material by growing silicon on an AlP substrate along (001) direction.

* * * * *